US012631940B2

(12) United States Patent
Feng et al.

(10) Patent No.: US 12,631,940 B2

(45) Date of Patent: May 19, 2026

(54) VARIABLE APERTURE ASSEMBLY AND ASSOCIATED METHOD

(71) Applicant: Hand Held Products, Inc., Charlotte, NC (US)

(72) Inventors: Chen Feng, Mount Laurel, NJ (US); Tao Xian, Princeton Junction, NJ (US); Eric Youngblood, Matthews, NC (US)

(73) Assignee: Hand Held Products, Inc., Charlotte, NC (US)

( * ) Notice: Subject to any disclaimer, the term of this patent is extended or adjusted under 35 U.S.C. 154(b) by 197 days.

(21) Appl. No.: 18/659,586

(22) Filed: May 9, 2024

(65) Prior Publication Data

US 2025/0347979 A1 Nov. 13, 2025

(51) Int. Cl.
*G03B 9/02* (2021.01)
*G02B 26/00* (2006.01)
*H10N 30/20* (2023.01)

(52) U.S. Cl.
CPC .............. *G03B 9/02* (2013.01); *G02B 26/004* (2013.01); *H10N 30/2047* (2023.02)

(58) Field of Classification Search
CPC ... G03B 9/02–07; G02B 5/005; G02B 26/004
See application file for complete search history.

(56) References Cited

U.S. PATENT DOCUMENTS 6,033,132 A 3/2000 Seo
7,410,309 B2 * 8/2008 Viinikanoja ........... H04N 23/55
359/228
2008/0084498 A1 4/2008 He et al.
2015/0319514 A1 11/2015 Hitchcock et al.
2016/0054483 A1 2/2016 Feng et al.

FOREIGN PATENT DOCUMENTS

EP 1798958 A1 * 6/2007 ............. G02B 5/005
KR 10-0650190 B1 11/2006

* cited by examiner

*Primary Examiner* — Leon W Rhodes, Jr.
(74) *Attorney, Agent, or Firm* — Alston & Bird LLP

(57) ABSTRACT

A variable aperture assembly is provided. For example, a variable aperture assembly comprises a piezoelectric annular bending disc, a polymer disc coupled to the bending disc, a cover glass coupled to the polymer disc, and a light absorptive fluid contained in a space between the polymer disc and the cover glass. The bending disc is selectively deformable when a voltage is applied. The polymer disc has a convex portion curved toward the cover glass. An area of contact between the convex portion and the cover glass defines an optical aperture. A size of the optical aperture is controlled by controlling a size of the area of contact between the convex portion and the cover glass. The size of the area of contact between the convex portion and the cover glass is controlled by controlling the voltage applied to the bending disc.

20 Claims, 13 Drawing Sheets

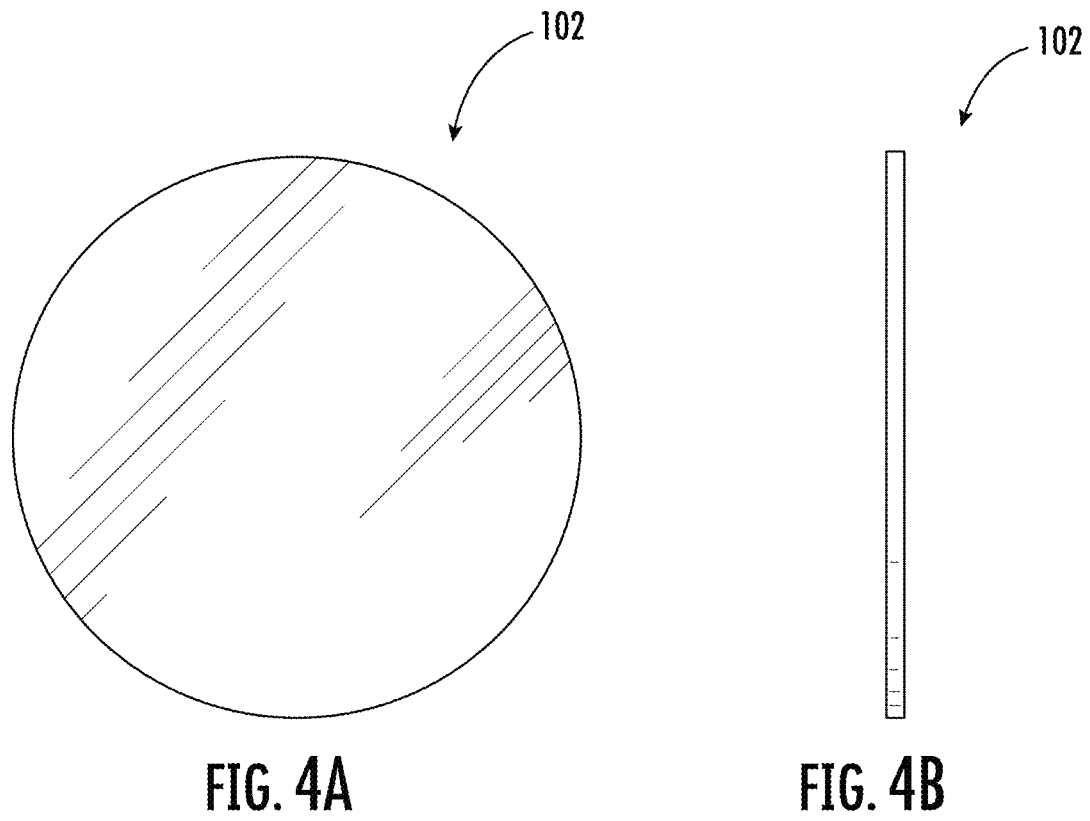
FIG. 4A                    FIG. 4B
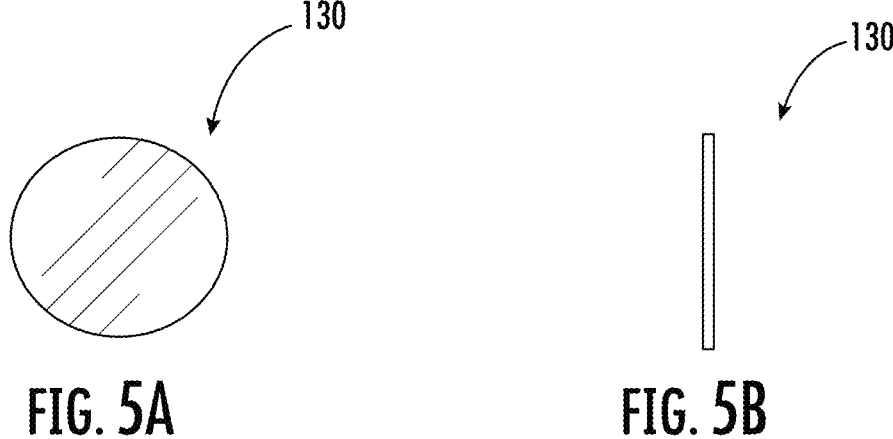
FIG. 5A                    FIG. 5B

VARIABLE APERTURE ASSEMBLY AND ASSOCIATED METHOD

FIELD OF THE INVENTION

Embodiments of the present disclosure generally relate to imaging devices, and, more particularly, to variable apertures for imaging devices.

BACKGROUND

Imaging devices, such as barcode scanners and the like, typically comprise at least a shutter, a lens, an aperture, and an imaging sensor. The shutter controls whether light enters the device, the aperture controls the amount of light that enters the device, the lens focuses the light, and the imaging sensor captures the light to form an image. The aperture is often variable so that more or less light may be allowed into the device depending on what is needed to obtain an acceptable image.

Traditional electro-mechanical variable apertures typically use electro-magnetic or piezo-electric actuators to change the position of moving parts in the variable aperture assembly to change the aperture. With such electro-mechanical apertures, the ability to quickly change the aperture is limited by the mass and inertia of the moving parts. The aperture accuracy is also limited by the stake-up tolerances and motion variations of the moving parts. Such electro-mechanical variable apertures respond slowly and therefore are not adequate for high speed applications.

As such, such imaging devices are plagued by technical challenges and limitations. Through applied effort, ingenuity, and innovation, many of these identified problems have been solved by developing solutions that are included in embodiments of the present disclosure, many examples of which are described in detail herein.

BRIEF SUMMARY

Various embodiments described herein relate to aperture assemblies for imaging devices, associated imaging devices, and associated methods of controlling an aperture of an imaging device.

In accordance with various embodiments of the present disclosure, a variable aperture assembly is provided. In some embodiments, a variable aperture assembly comprises a piezoelectric annular bending disc defining a center opening and having opposing first and second major sides, a polymer disc having opposing first and second major sides, a cover glass having opposing first and second major sides, and a light absorptive fluid contained in a space between the polymer disc and the cover glass. The bending disc is selectively deformable toward the first major side when a voltage is applied across first and second electrodes of the bending disc. The second major side of the polymer disc is coupled to the first major side of the bending disc. The polymer disc has a raised perimeter around its first major side. The first side of the polymer disc has a convex portion. The second major side of the cover glass is coupled to the raised perimeter of the polymer disc. When the bending disc is not deformed, an area of contact between the convex portion of the polymer disc and the second major side of the cover glass has a first size. When the bending disc is maximally deformed, the area of contact between the convex portion of the polymer disc and the second major side of the cover glass has a second size greater than the first size. When the bending disc is less than maximally deformed, the area of contact between the convex portion of the polymer disc and the second major side of the cover glass has a size less than the second size and greater than the first size. The area of contact between the convex portion of the polymer disc and the second major side of the cover glass defines an optical aperture controlling an amount of light that can pass through the variable aperture assembly. A size of the optical aperture is controlled by controlling a size of the area of contact between the convex portion of the polymer disc and the second major side of the cover glass. The size of the area of contact between the convex portion of the polymer disc and the second major side of the cover glass is controlled by controlling the voltage applied across the first and second electrodes of the bending disc.

In some embodiments, the variable aperture assembly further comprises a protective cover spanning the center opening of the bending disc. The protective cover is held in place by the polymer disc.

In some embodiments, the cover glass comprises optical glass or an optical polymer and the polymer disc comprises an optical polymer.

In some embodiments, the optical polymer comprises polydimethylsiloxane.

In some embodiments, the area of contact between the convex portion of the polymer disc and the second major side of the cover glass when the bending disc is not deformed has a diameter of about 0.4 millimeters and the area of contact between the convex portion of the polymer disc and the second major side of the cover glass when the bending disc is maximally deformed has a diameter of about 2.0 millimeters.

In some embodiments, the first major side of the cover glass has an anti-reflective coating.

In some embodiments, the second major side of the cover glass has a hydrophobic coating.

In some embodiments, the hydrophobic coating on the second major side of the cover glass does not extend to the perimeter of the second major side of the cover glass.

In some embodiments, the light absorptive fluid comprises a mixture of deionized water and a light absorptive dye.

In some embodiments, the polymer disc is over-molded onto the bending disc.

In accordance with various embodiments of the present disclosure, a method of controlling an aperture of an imaging device is provided. In some embodiments, the method comprises providing a variable aperture assembly, as described above, in an imaging device, the variable aperture assembly positioned in a light path between a shutter and an imaging sensor, and applying a voltage to the first and second electrodes of the bending disc to cause a deformation of the bending disc corresponding to a desired size of the area of contact between the convex portion of the polymer disc and the second major side of the cover glass.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which:

FIG. 4A is a front view of an example cover glass of the example variable aperture assembly of FIG. 1;

FIG. 4B is a side view of an example cover glass of the example variable aperture assembly of FIG. 1;

FIG. 5A is a front view of an example protective cover of the example variable aperture assembly of FIG. 1;

FIG. 5B is a side view of an example protective cover of the example variable aperture assembly of FIG. 1;

DETAILED DESCRIPTION OF THE INVENTION

Figure 1:
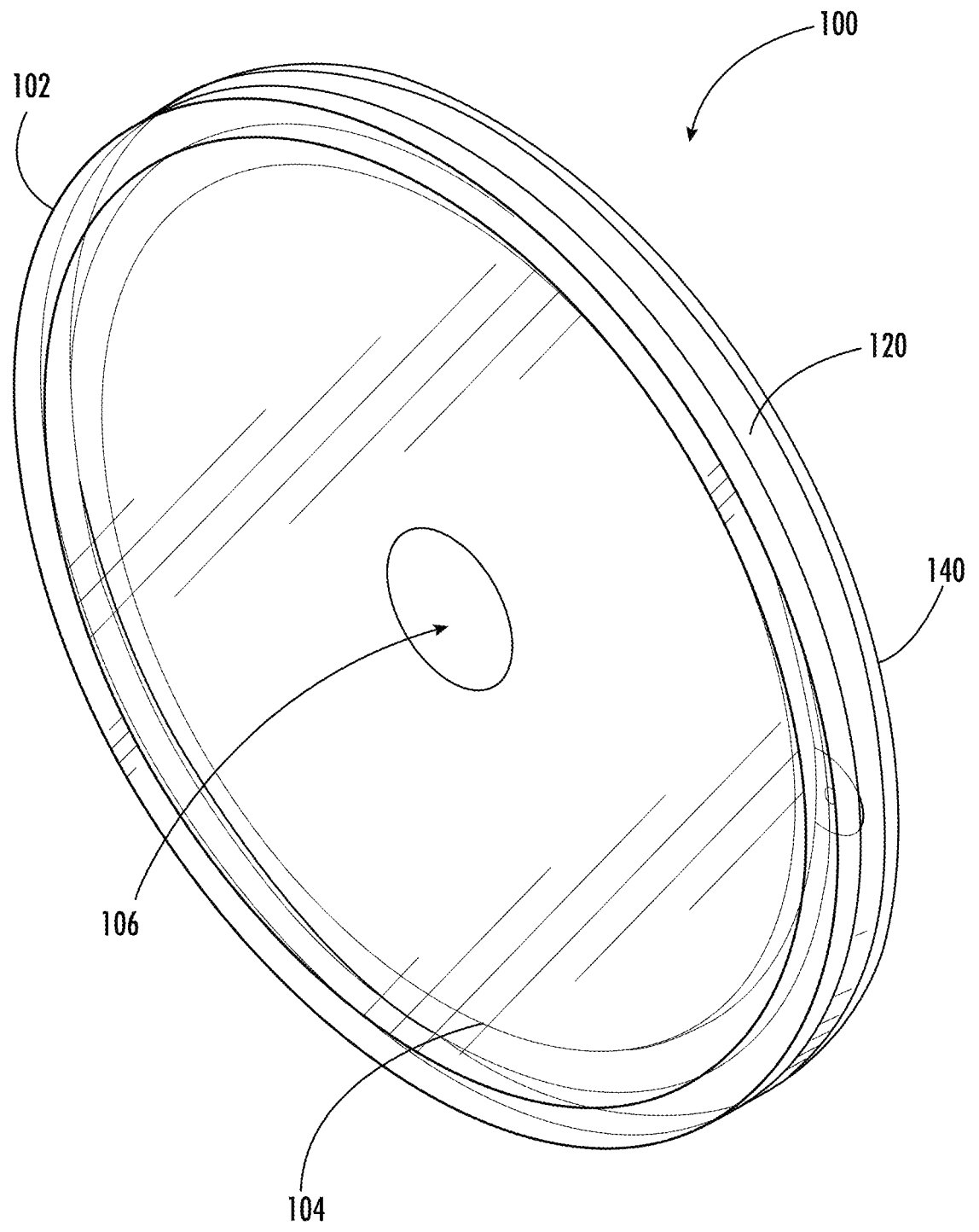
FIG. 1 is a perspective view of an example variable aperture assembly in accordance with example embodiments of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," "bottom," "left," "right," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The phrases "in one example," "according to one example," "in some examples," and the like generally mean that the particular feature, structure, or characteristic following the phrase may be included in at least one example of the present disclosure and may be included in more than one example of the present disclosure (importantly, such phrases do not necessarily refer to the same example).

Any reference to claim elements in the singular, for example, using the articles "a," "an" or "the," is not to be construed as limiting the element to the singular and may, in some instances, be construed in the plural.

If the specification states a component or feature "may," "can," "could," "should," "would," "preferably," "possibly," "typically," "optionally," "for example," "as an example," "in some examples," "often," or "might" (or other such language) be included or have a characteristic, that specific component or feature is not required to be included or to have the characteristic. Such component or feature may be optionally included in some examples, or it may be excluded.

The word "example" or "exemplary" is used herein to mean "serving as an example, instance, or illustration." Any implementation described herein as "example" or "exemplary" is not necessarily to be construed as preferred or advantageous over other implementations.

The term "electronically coupled," "electronically coupling," "electronically couple," "in communication with," "in electronic communication with," or "connected" in the present disclosure refers to two or more elements or components being connected through wired means and/or wireless means, such that signals, electrical voltage/current, data and/or information may be transmitted to and/or received from these elements or components.

The term "fluidly coupled," "fluidly coupling," "fluidly couple," "in fluid communication with," "in fluid connection with," or "fluidly connected" in the present disclosure refers to two or more elements or components being connected, directly or indirectly, such that a fluid may flow, directly or indirectly, between the two or more elements or components.

The term "component" may refer to an article, a device, or an apparatus that may comprise one or more surfaces, portions, layers and/or elements. For example, an example component may comprise one or more substrates that may provide underlying layer(s) for the component and may comprise one or more elements that may form part of and/or are disposed on top of the substrate. In the present disclosure, the term "element" may refer to an article, a device, or an apparatus that may provide one or more functionalities.

Various embodiments of the present disclosure overcome the above technical challenges and difficulties and provide various technical improvements and advantages. For example, various embodiments of the present disclosure provide an example variable aperture assembly. Various embodiments of the present disclosure provide an example imaging device. Various embodiments of the present disclosure provide an example method of controlling an aperture of an imaging device.

In various embodiments, a deformable aperture assembly is provided which provides a variable aperture without any moving parts, thereby providing fast and accurate aperture size selection. The variable aperture assembly of embodiments of the present disclosure may be used in any suitable device, including any suitable imaging device, including but not limited to bar code readers and the like.

In various embodiments, a polymer disc is coupled on a first side to a cover glass and on a second side to a piezoelectric annular bending disc. In various embodiments, the first side of the polymer disc has a convex portion that contacts the cover glass, such that the contact area between the convex portion of the polymer disc and the cover glass forms an effective clear aperture. In various embodiments, a light absorptive fluid is contained in a space between the polymer disc and the cover glass. In various embodiments, an electric field applied to the bending disc deforms the bending disc and correspondingly deforms the polymer disc, thereby changing the size of the contact area between the convex portion of the polymer disc and the cover glass which changes the effective aperture size.

Figure 2:
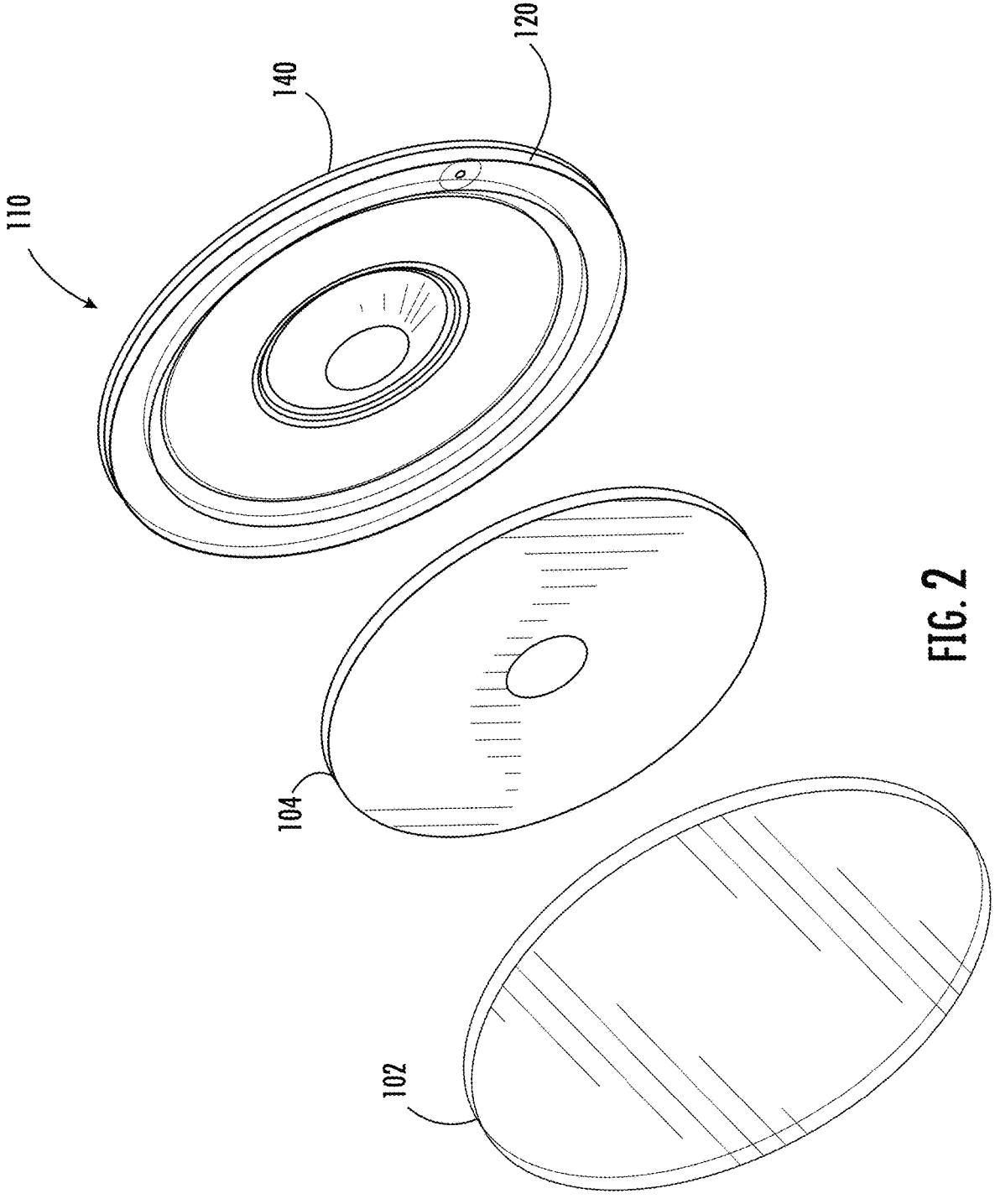
FIG. 2 is an exploded perspective view of the example variable aperture assembly of FIG. 1.
Figure 3:
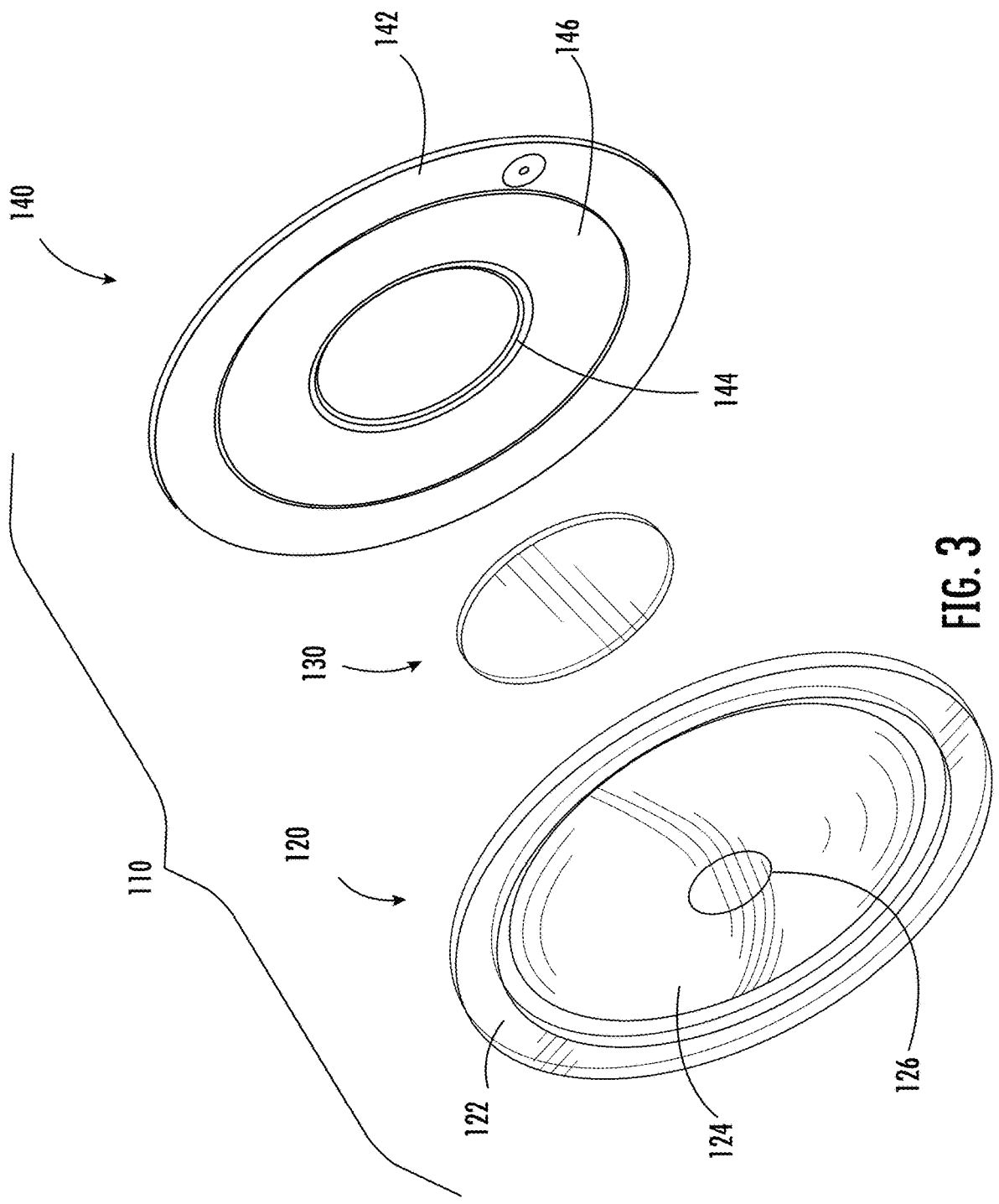
FIG. 3 is a further exploded perspective view of a portion of the example variable aperture assembly of FIG. 1 as shown in FIG. 2.
Figures 6A, 6B, 6C:
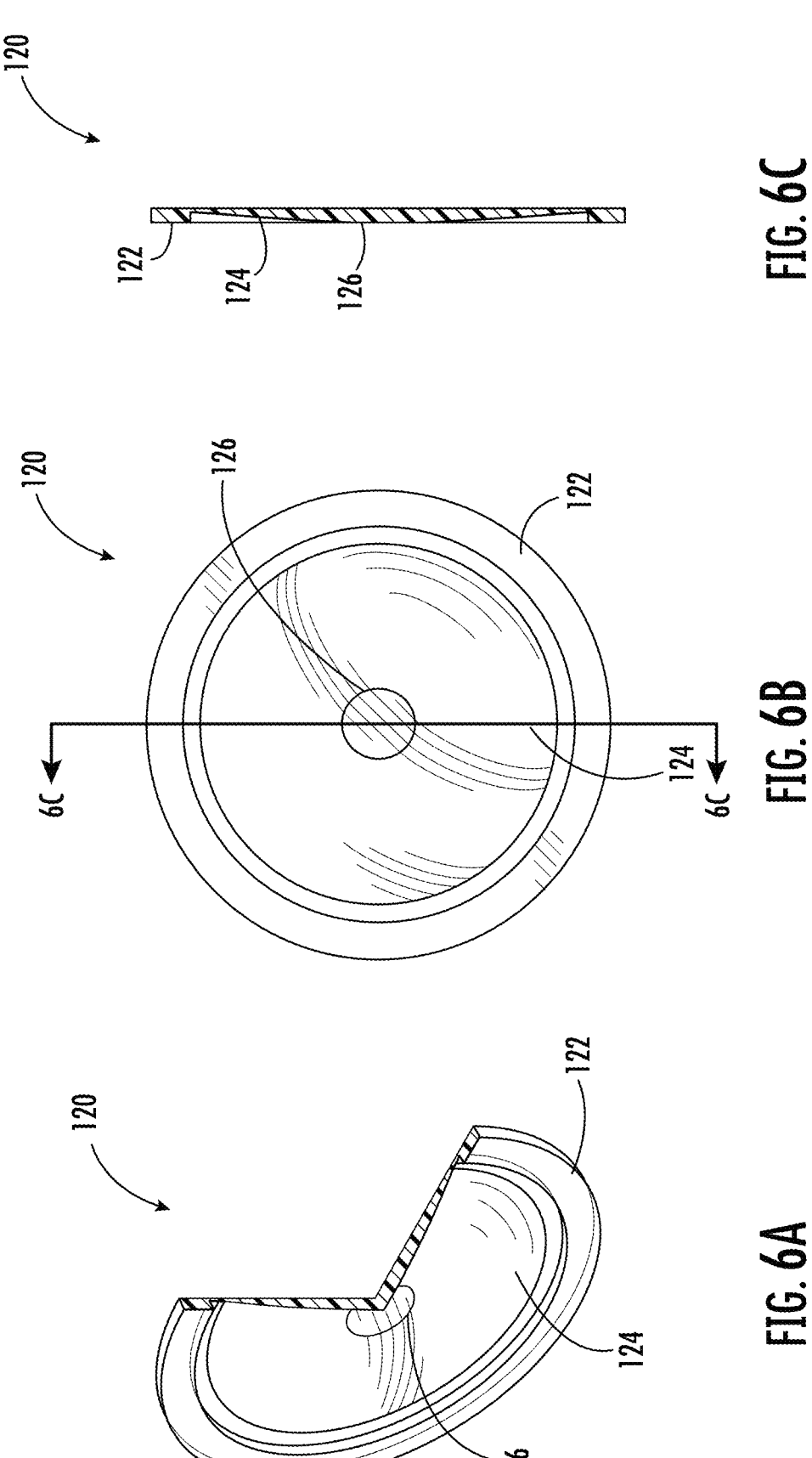
FIG. 6A is a half sectional view of an example polymer disc of the example variable aperture assembly of FIG. 1.
FIG. 6B is a front view of the example polymer disc of FIG. 6A.
FIG. 6C is a sectional view of the example polymer disc of FIG. 6A.
Figures 7A, 7B, 7C:
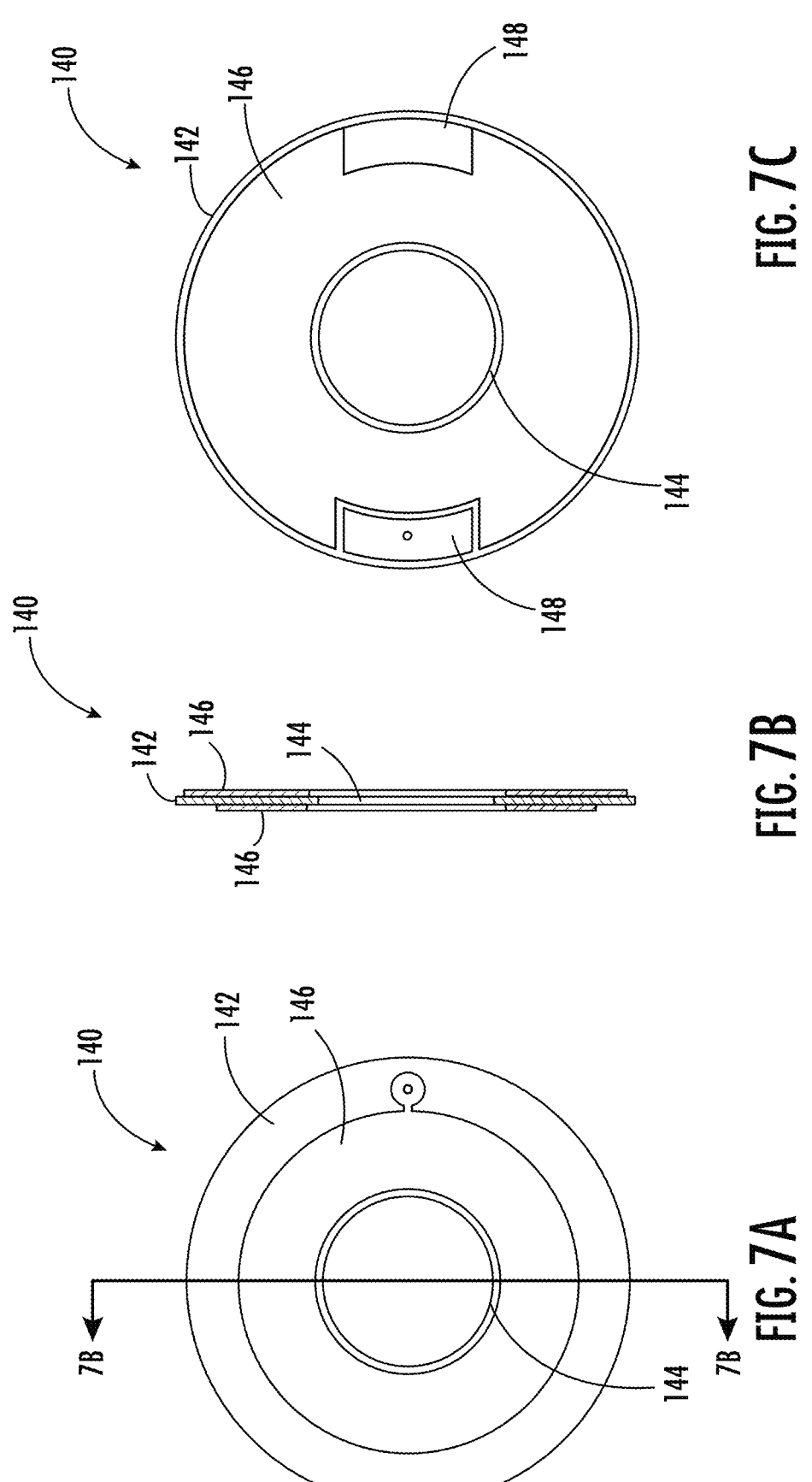
FIG. 7A is a front view of an example bender disc of the example variable aperture assembly of FIG. 1.
FIG. 7B is a sectional view of the example bender disc of FIG. 7A.
FIG. 7C is a rear view of the example bender disc of FIG. 7A.

Referring now to FIGS. 1-11, an example variable aperture assembly is illustrated in accordance with example embodiments of the present disclosure. As best seen in FIG. 2, the variable aperture assembly 100 of FIGS. 1-11 comprises a cover glass 102, an aperture sub-assembly 110, and a light absorptive fluid 104 contained in a space between the cover glass 102 and the aperture sub-assembly 110. The light absorptive fluid 104 is illustrated in FIG. 2 in the shape it will attain when sandwiched between the cover glass 102 and the aperture sub-assembly 110. As best seen in FIG. 3, the aperture sub-assembly 110 comprises a piezoelectric annular bending disc 140 defining a center opening 144, a protective cover 130 spanning the center opening 144 of the bending disc 140, and a polymer disc 120.

In various embodiments, the cover glass 102, the polymer disc 120, the protective cover 130, and the bending disc 140 all have opposing first and second major sides. In FIGS. 2 and 3, the first major sides of the cover glass 102, the polymer disc 120, the protective cover 130, and the bending disc 140 are the sides that are visible, while the second major sides are the sides that are not visible. In various embodiments, the second major side of the cover glass 102 is coupled to the first major side of the polymer disc 120 and the second major side of the polymer disc 120 is coupled to the first major side of the bending disc 140. In various embodiments, the cover glass 102 is coupled to the polymer disc 120 via a contact bond between the two materials (i.e., an adhesive is generally not required). In various embodiments, the polymer disc 120 is over-molded onto the bending disc 140. In various embodiments, the protective cover 130 is held in place by the over-molded polymer disc 120.

In various embodiments, the cover glass 102 comprises a borosilicate glass, such as Schott D263M, although any suitable optical glass or optical polymer may be used. In various embodiments, the polymer disc 120 comprises a silicone elastomer, such as polydimethylsiloxane (e.g., Sylgard 184 from Dow), although any suitable optical polymer may be used. In various embodiments, the polymer disc 120 comprises a material having a hardness of 20 Shore A to enable the desired combination of stiffness and pliability to function as described herein. In various embodiments, the protective cover 130 comprises a borosilicate glass, such as Schott D263M, although any suitable optical glass or optical polymer may be used. In various embodiments, the light absorptive fluid 104 comprises a mixture of deionized water and a light absorptive dye, such as 10% Epson T664BK in deionized water, although any suitable light absorptive fluid may be used.

In various embodiments, the first major side of the cover glass 102 has an anti-reflective coating. In various embodiments, the second major side of the cover glass 102 has a hydrophobic coating, such as a Teflon coating. In some embodiments, the hydrophobic coating on the second major side of the cover glass 102 does not extend to its perimeter to enable the contact bond between the cover glass 102 and the polymer disc 120.

In various embodiments, the first major side of the polymer disc 120 has a raised perimeter 122 and a convex portion 124. The second major side of the cover glass 102 is coupled to the raised perimeter 122 of the polymer disc 120.

In various embodiments, the bending disc 140 comprises a piezoelectric bimorph bending disc that deforms when an electric field is applied. In the illustrated embodiment, the bending disc 140 deforms or bulges toward the first major side when a voltage is applied to electrodes 148. In various embodiments, the amount of deformation varies depending on the amount of voltage applied. In the illustrated embodiment, the bending disc 140 comprises a piezoelectric main body 142 with a gold coating 146 on both the first and second major sides of the main body 142. In various embodiments, the specific type of bending disc, the specific materials of which it is constructed, the specific size, etc., may vary depending on the specific configuration of the variable aperture assembly of embodiments of the present disclosure.

In various embodiments, the physical structure and arrangement of the components, e.g., the thickness and shape of the convex portion 124, the thickness of the raised perimeter 122 (which determines the distance between the cover glass 102 and the bending disc 140), etc., are selected such that, when the bending disc 140 is not deformed (i.e., no voltage is applied), the center of the convex portion 124 of the polymer disc 120 contacts the second major side of the cover glass 102, flattening an area of the convex portion 124 against the cover glass 102. This area of contact 126 has a first size when the bending disc 140 is not deformed. The first size of the area of contact 126 depends on the selected physical structure and arrangement of the components.

In various embodiments, the contact between the convex portion 124 and the cover glass 102, assisted by the hydrophobic coating of the second major surface of the cover glass 102, expels all or almost all of the light absorptive fluid 104 from between the area of contact 126 and the cover glass 102. Due to the lack of light absorptive fluid 104 in the area of contact and the optical properties of the cover glass 102 and the polymer disc 120, an optical aperture 106 through which light can pass is formed corresponding to the area of contact. In various embodiments, the light absorptive fluid 104 surrounding the area of contact 126 blocks light so that light only passes through the optical aperture 106 (i.e., the area of contact). Since the center opening 144 of the bending disc 140 is larger than the optical aperture 106, the size of the optical aperture 106 controls the amount of light passing through the variable aperture assembly 100.

In various embodiments, the size of the area of contact 126, and therefore the size of the optical aperture 106, can be varied to allow a desired amount of light to pass through the variable aperture assembly 100. In various embodiments, the size of the area of contact 126 can be varied by applying a predetermined voltage to the electrodes 148 of the bending disc to cause a desired amount of deformation of the bending disc 140 which causes a corresponding amount of bulging of the convex portion 124 of the polymer disc 120, thereby causing the area of contact 126 to be a corresponding desired size.

In various embodiments, when the bending disc 140 is maximally deformed, the area of contact 126 between the convex portion 124 of the polymer disc 120 and the cover glass 102 has a second size greater than the first size. When the bending disc 140 is less than maximally deformed (but still deformed), the area of contact 126 between the convex portion 124 of the polymer disc 120 and the cover glass 102 has a size between the first size and the second size.

In various embodiments, the specific voltage needed to be applied to the electrodes 148 of the bending disc to cause the area of contact 126 to be a corresponding desired size is predetermined so that the desired optical aperture size can be selected as needed during operation of an imaging device having such a variable aperture assembly. In various embodiments, a plurality of different specific incremental voltages is predetermined which correspond to a plurality of different incremental sizes of the optical aperture. In various other embodiments, a specific voltage is predetermined for the maximum optical aperture size (the minimum optical aperture size corresponds to zero voltage), and the voltage applied is infinitely variable such that the optical aperture size is infinitely variable between the minimum and maximum sizes.

Figure 8C:
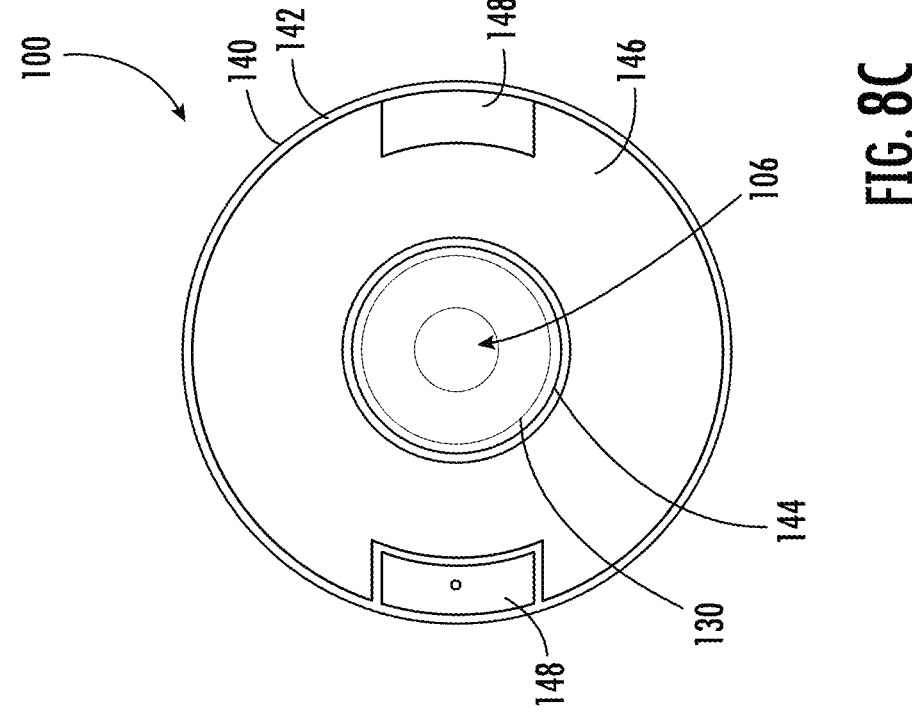
FIG. 8C is a rear view of the example variable aperture assembly of FIG. 8A.
Figure 8A:
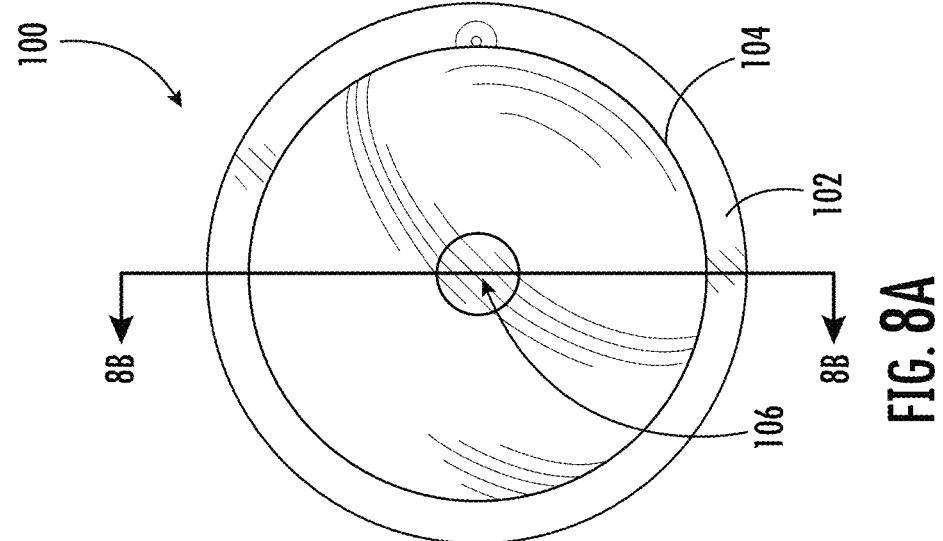
FIG. 8A is a front view of the example variable aperture assembly of FIG. 1, in a first configuration.
Figure 8B:
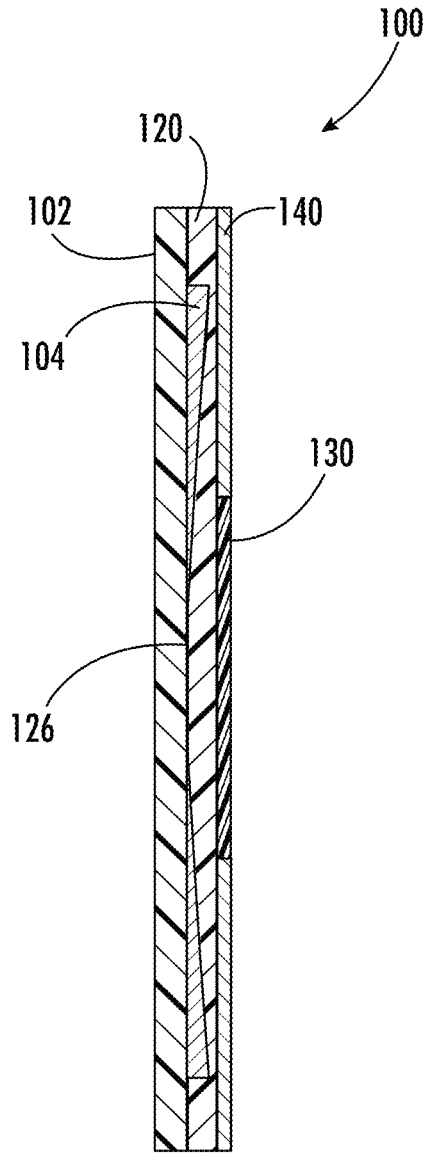
FIG. 8B is a sectional view the example variable aperture assembly of FIG. 8A.
Figure 9:
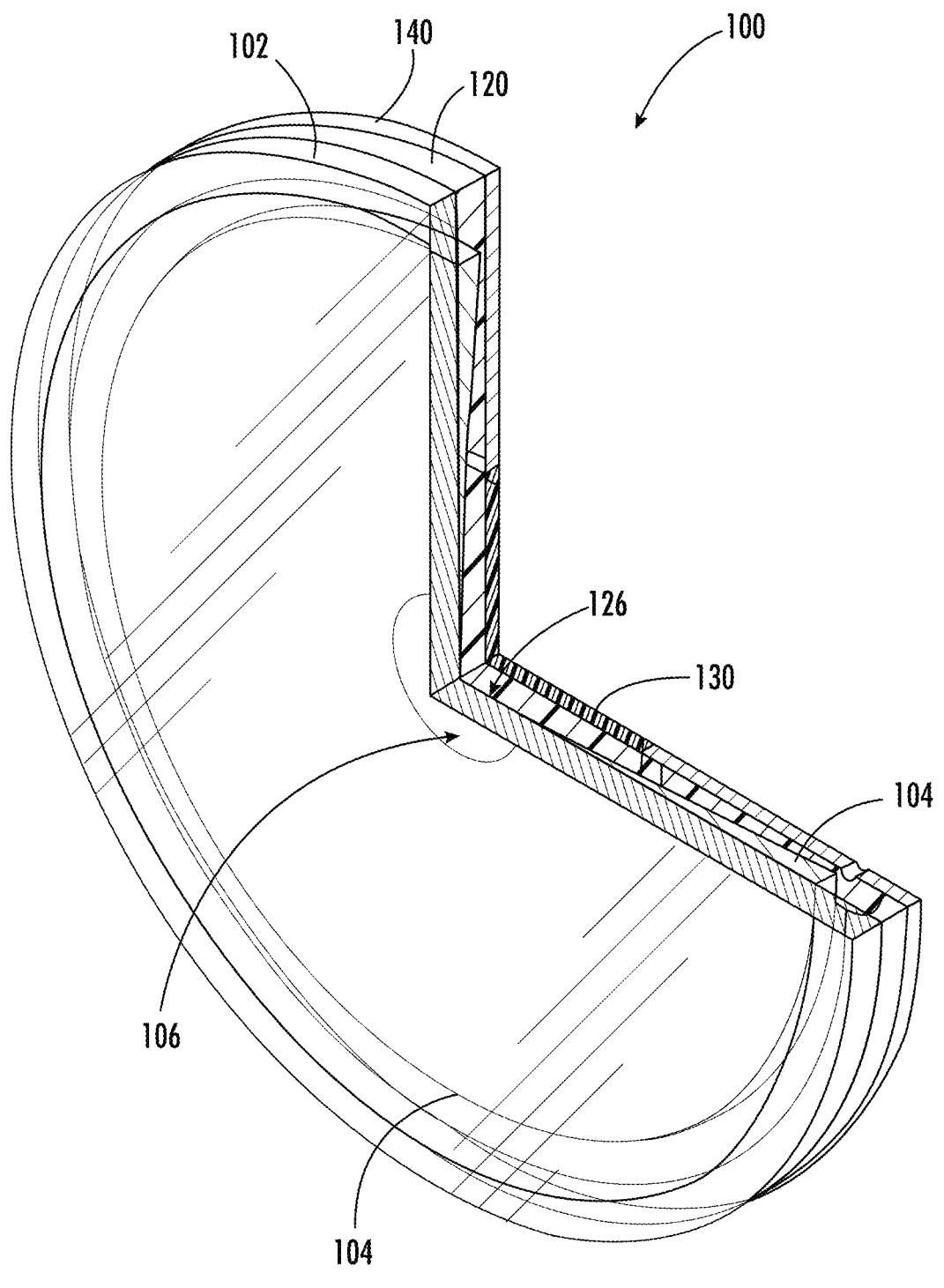
FIG. 9 is a half sectional view of the example variable aperture assembly of FIG. 8A.

In the illustrated embodiment, FIGS. 8A, 8B, and 9 show a variable aperture assembly 100 in which the bending disc 140 is not deformed (i.e., no voltage is applied) and the area of contact 126 has a first or minimum size. In an example embodiment, the area of contact 126 (and therefore the optical aperture 106) when the bending disc 140 is not deformed has a diameter of about 0.4 millimeters.

Figure 10C:
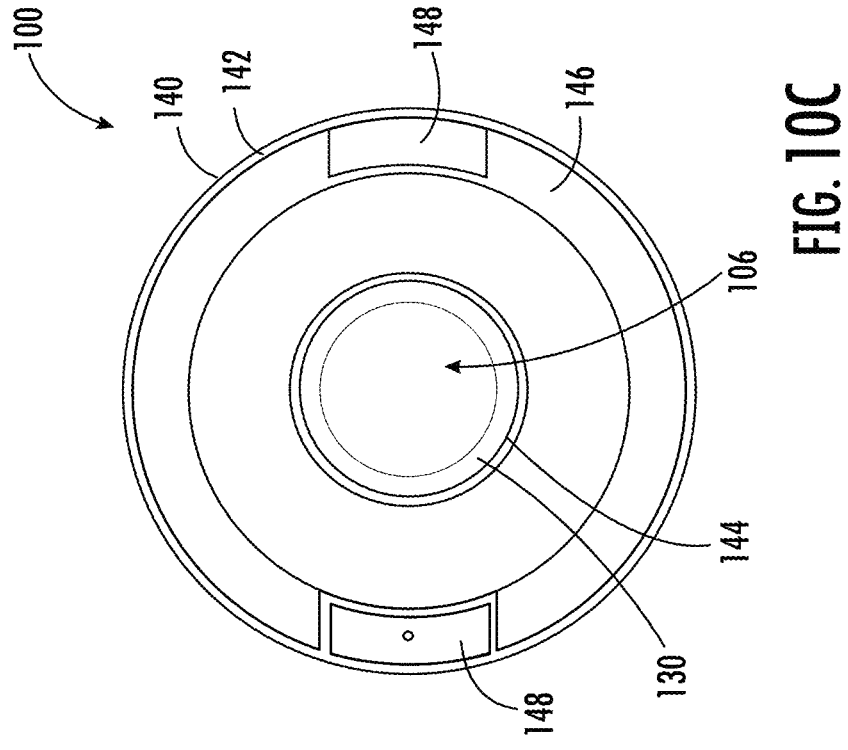
FIG. 10C is a rear view of the example variable aperture assembly of FIG. 10A.
Figure 10A:
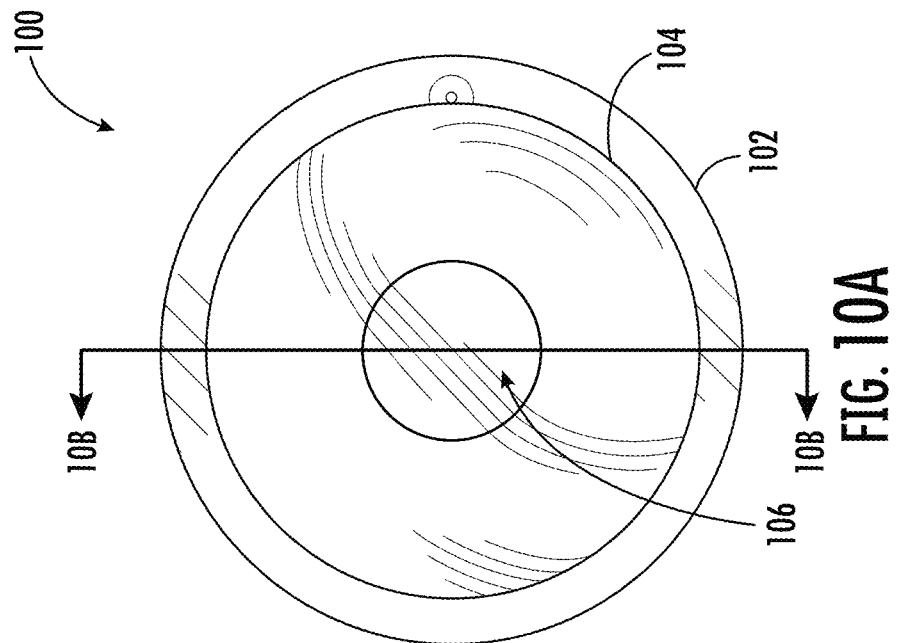
FIG. 10A is a front view of the example variable aperture assembly of FIG. 1, in a second configuration.
Figure 10B:
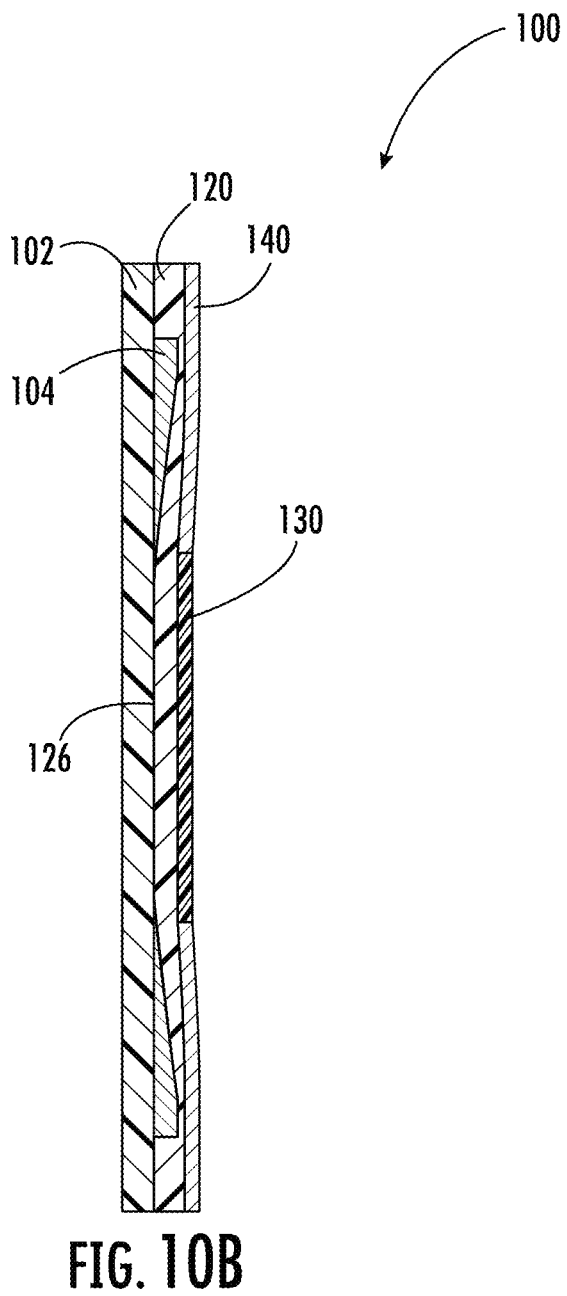
FIG. 10B is a sectional view the example variable aperture assembly of FIG. 10A.
Figure 11:
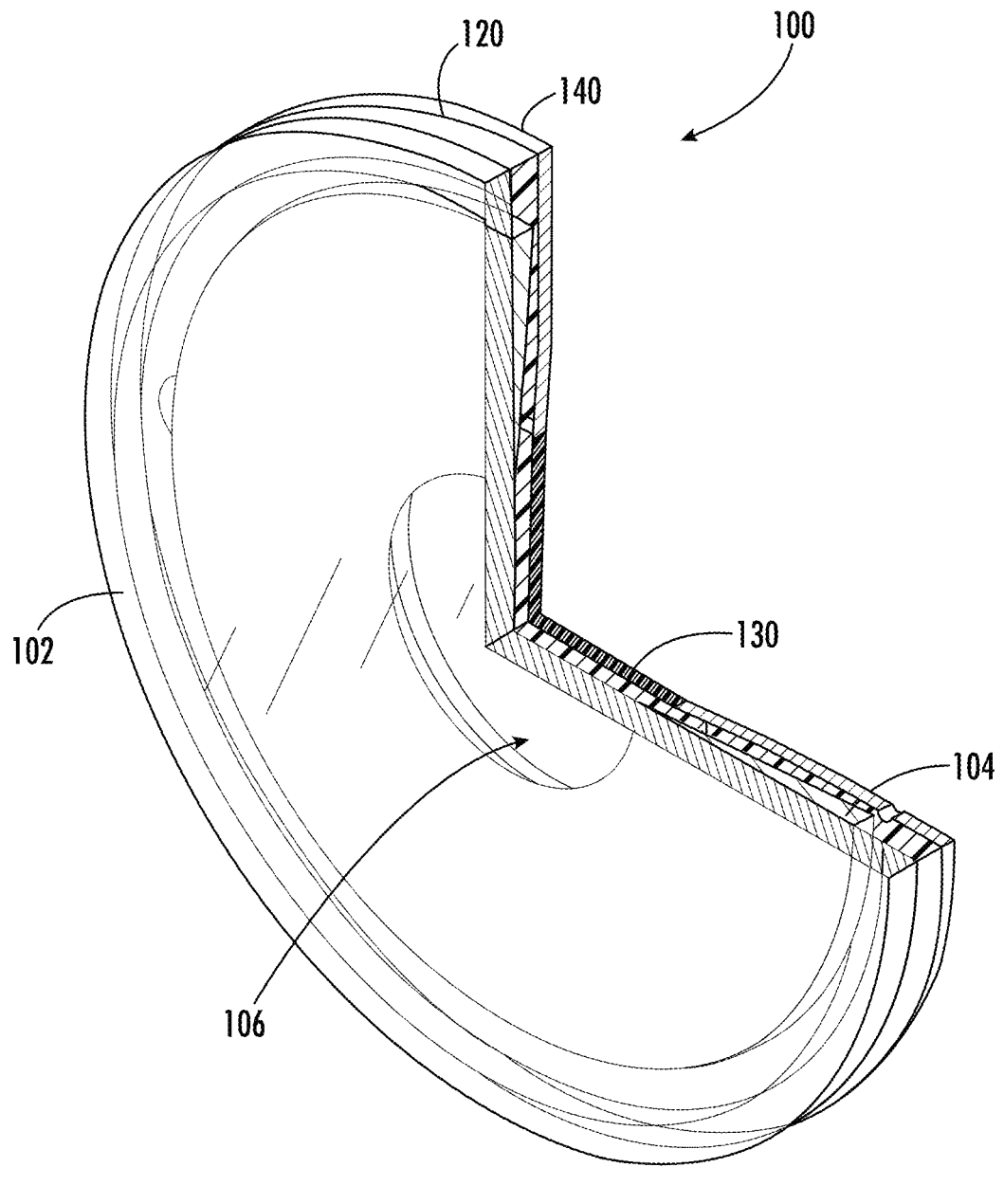
FIG. 11 is a half sectional view of the example variable aperture assembly of FIG. 10A.

In the illustrated embodiment, FIGS. 10A, 10B, and 11 show a variable aperture assembly 100 in which the bending disc 140 is maximally deformed and the area of contact 126 has a second or maximum size. In an example embodiment, the area of contact 126 (and therefore the optical aperture 106) when the bending disc 140 is maximally deformed has a diameter of about 2.0 millimeters.

Figure 12:
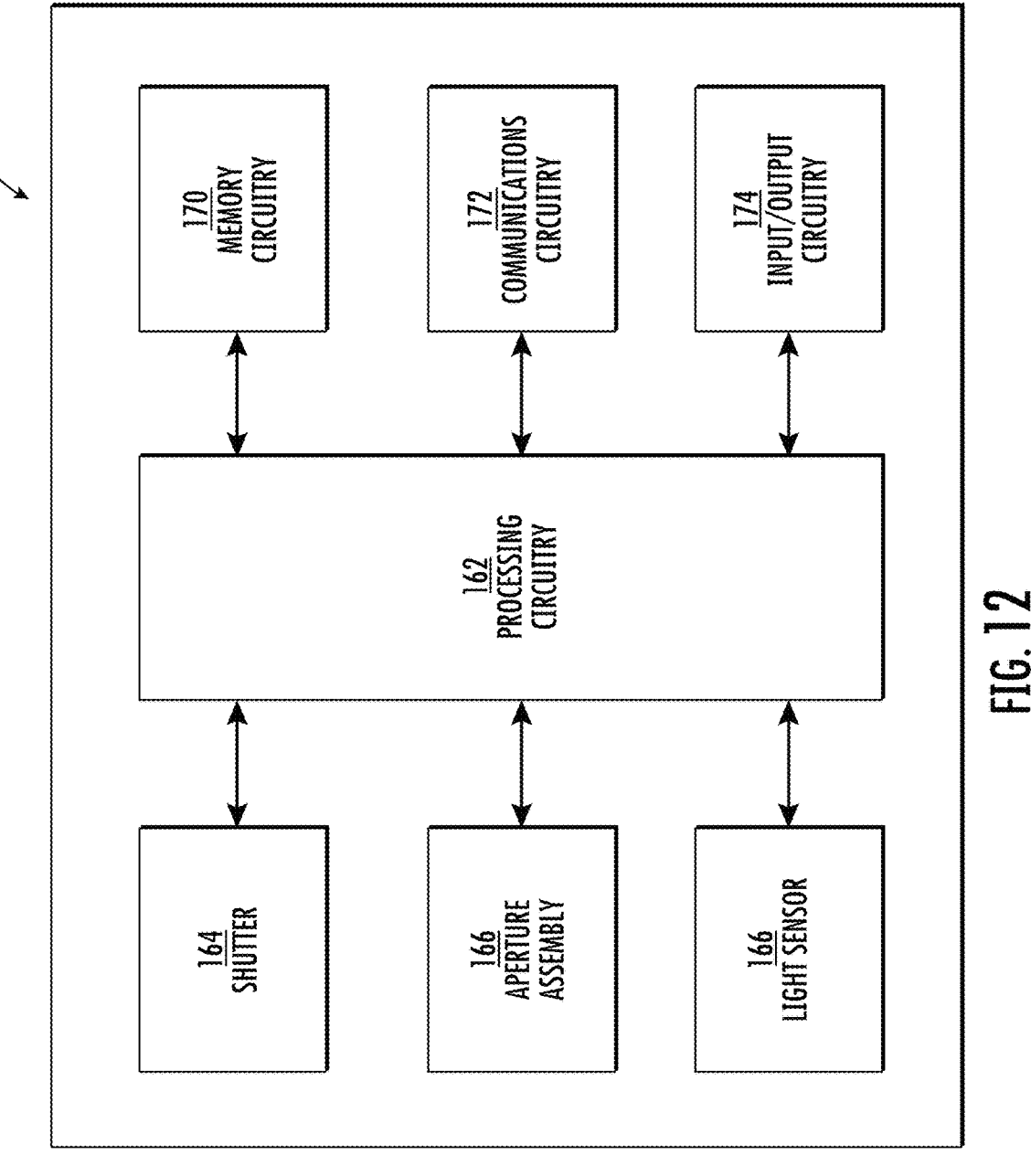
FIG. 12 is a block diagram of an imaging device in accordance with example embodiments of the present disclosure.

Referring now to FIG. 12, a block diagram of various components of an example imaging device is provided. As depicted in FIG. 12, in some embodiments the example imaging device 160 comprises a processor or processing circuitry 162, a shutter 164 that is selectively openable to allow light to enter the imaging device to capture an image, a variable aperture assembly 166 as described herein, a light sensor 168 to capture the incoming light, memory circuitry 170, input/output circuitry 172, and communications circuitry 174. In some embodiments, one or more portions of the example imaging device 160 are configured to execute and perform the operations described herein.

Although components are described with respect to functional limitations, it should be understood that at least some of the particular implementations necessarily include the use of particular computing hardware. It should also be understood that in some embodiments certain of the components described herein include similar or common hardware. For example, in some embodiments two sets of circuitry both leverage use of the same processor(s), memory(ies), circuitry(ies), and/or the like to perform their associated functions such that duplicate hardware is not required for each set of circuitry.

Processing circuitry 162 may be embodied in a number of different ways. In various embodiments, the use of the terms "processor" or "processing circuitry" should be understood to include a single core processor, a multi-core processor, multiple processors internal to the example imaging device 160, and/or one or more remote or "cloud" processor(s) external to the example imaging device 160. In some example embodiments, processing circuitry 162 may include one or more processing devices configured to perform independently. Alternatively, or additionally, processing circuitry 162 may include one or more processor(s) configured in tandem via a bus to enable independent execution of operations, instructions, pipelining, and/or multithreading.

In an example embodiment, the processing circuitry 162 may be configured to execute instructions stored in the memory circuitry 170 or otherwise accessible to the processor. Alternatively, or additionally, the processing circuitry 162 may be configured to execute hard-coded functionality. As such, whether configured by hardware or software methods, or by a combination thereof, processing circuitry 162 may represent an entity (e.g., physically embodied in circuitry) capable of performing operations according to embodiments of the present disclosure while configured accordingly. Alternatively, or additionally, processing circuitry 162 may be embodied as an executor of software instructions, and the instructions may specifically configure the processing circuitry 162 to perform the various algorithms embodied in one or more operations described herein when such instructions are executed. In some embodiments, the processing circuitry 162 includes hardware, software, firmware, and/or a combination thereof that performs one or more operations described herein.

In some embodiments, the processing circuitry 162 (and/or co-processor or any other processing circuitry assisting or otherwise associated with the processor) is/are in communication with the memory circuitry 170 via a bus for passing information among components of the example imaging device 160.

Memory or memory circuitry 170 may be non-transitory and may include, for example, one or more volatile and/or non-volatile memories. In some embodiments, the memory circuitry 170 includes or embodies an electronic storage device (e.g., a computer readable storage medium). In some embodiments, the memory circuitry 170 is configured to store information, data, content, applications, instructions, or the like, for enabling the example imaging device 160 to carry out various operations and/or functions in accordance with example embodiments of the present disclosure.

Input/output circuitry 172 may be included in the example imaging device 160. In some embodiments, input/output circuitry 172 may provide output to the user and/or receive input from a user. The input/output circuitry 172 may be in communication with the processing circuitry 162 to provide such functionality. The input/output circuitry 172 may comprise one or more user interface(s). In some embodiments, a user interface may include a display that comprises the interface(s) rendered as a web user interface, an application user interface, a user device, a backend system, or the like. In some embodiments, the input/output circuitry 172 also includes a keyboard, a mouse, a joystick, a touch screen, touch areas, soft keys a microphone, a speaker, or other input/output mechanisms. The processing circuitry 162 and/or input/output circuitry 172 may be configured to control one or more operations and/or functions of one or more user interface elements through computer program instructions (e.g., software and/or firmware) stored on a memory accessible to the processor (e.g., memory circuitry 170, and/or the like). In some embodiments, the input/output circuitry 172 includes or utilizes a user-facing application to provide input/output functionality to a computing device and/or other display associated with a user.

Communications circuitry 174 may be included in the example imaging device 160. The communications circuitry 174 may include any means such as a device or circuitry embodied in either hardware or a combination of hardware and software that is configured to receive and/or transmit data from/to a network and/or any other device, circuitry, or module in communication with the example imaging device 160. In some embodiments the communications circuitry 174 includes, for example, a network interface for enabling communications with a wired or wireless communications network. Additionally or alternatively, the communications circuitry 174 may include one or more network interface card(s), antenna(s), bus(es), switch(es), router(s), modem(s), and supporting hardware, firmware, and/or software, or any other device suitable for enabling communications via one or more communications network(s). In some embodiments, the communications circuitry 174 may include circuitry for interacting with an antenna(s) and/or other hardware or software to cause transmission of signals via the antenna(s) and/or to handle receipt of signals received via the antenna (s). In some embodiments, the communications circuitry 174 enables transmission to and/or receipt of data from a user device, one or more sensors, and/or other external computing device(s) in communication with the example imaging device 160.

In some embodiments, two or more of the sets of circuitry 162, 170-174 are combinable. Alternatively, or additionally, one or more of the sets of circuitry 162, 170-174 perform some or all of the operations and/or functionality described herein as being associated with another circuitry. In some embodiments, two or more of the sets of circuitry 162, 170-174 are combined into a single module embodied in hardware, software, firmware, and/or a combination thereof.

While the description above provides an example imaging device 160, it is noted that the scope of the present disclosure is not limited to the description above. In some examples, an example imaging device 160 in accordance with the present disclosure may be in other forms. In some examples, an example imaging device 160 may comprise one or more additional and/or alternative elements, and/or may be structured differently than that illustrated in FIG. 12.

While various embodiments in accordance with the principles disclosed herein have been shown and described above, modifications thereof may be made by one skilled in the art without departing from the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present disclosure. Furthermore, any advantages and features described above may relate to specific embodiments but shall not limit the application of such issued claims to processes and structures accomplishing any or all of the above advantages or having any or all of the above features.

In addition, the section headings used herein are provided for consistency with the suggestions under 37 C.F.R. § 1.77 or to otherwise provide organizational cues. These headings shall not limit or characterize the disclosure set out in any claims that may issue from this disclosure. For instance, a description of a technology in the "Background" is not to be construed as an admission that certain technology is prior art to any disclosure in this disclosure. Neither is the "Summary" to be considered as a limiting characterization of the disclosure set forth in issued claims. Furthermore, any reference in this disclosure to "disclosure" or "embodiment" in the singular should not be used to argue that there is only a single point of novelty in this disclosure. Multiple embodiments of the present disclosure may be set forth according to the limitations of the multiple claims issuing from this disclosure, and such claims accordingly define the disclosure, and their equivalents, which are protected thereby. In all instances, the scope of the claims shall be considered on their own merits in light of this disclosure but should not be constrained by the headings set forth herein.

Also, systems, subsystems, apparatuses, techniques, and methods described and illustrated in the various embodiments as discrete or separate may be combined or integrated with other systems, modules, techniques, or methods without departing from the scope of the present disclosure. Other devices or components shown or discussed as coupled to, or in communication with, each other may be indirectly coupled through some intermediate device or component, whether electrically, mechanically, or otherwise. Other examples of changes, substitutions, and alterations are ascertainable by one skilled in the art and could be made without departing from the scope disclosed herein.

Many modifications and other embodiments of the disclosure set forth herein will come to mind to one skilled in the art to which these embodiments pertain having the benefit of teachings presented in the foregoing descriptions and the associated figures. Although the figures only show certain components of the apparatuses and systems described herein, various other components may be used in conjunction with the components and structures disclosed herein. Therefore, it is to be understood that the disclosure is not to be limited to the specific embodiments disclosed and that modifications and other embodiments are intended to be included within the scope of the appended claims. For example, the various elements or components may be combined, rearranged, or integrated in another system or certain features may be omitted or not implemented. Moreover, the steps in any method described above may not necessarily occur in the order depicted in the accompanying drawings, and in some cases one or more of the steps depicted may occur substantially simultaneously, or additional steps may be involved. Although specific terms are employed herein, they are used in a generic and descriptive sense only and not for purposes of limitation.

What is claimed is:

1. A variable aperture assembly for an imaging device, the variable aperture assembly comprising:
    a piezoelectric annular bending disc defining a center opening and having opposing first and second major sides, the bending disc being selectively deformable toward the first major side when a voltage is applied across first and second electrodes of the bending disc;

a polymer disc having opposing first and second major sides, the second major side of the polymer disc being coupled to the first major side of the bending disc, the polymer disc having a raised perimeter around its first major side, the first major side of the polymer disc having a convex portion;

a cover glass having opposing first and second major sides, the second major side of the cover glass being coupled to the raised perimeter of the polymer disc; and a light absorptive fluid contained in a space between the polymer disc and the cover glass;

wherein, when the bending disc is not deformed, an area of contact between the convex portion of the polymer disc and the second major side of the cover glass has a first size;

wherein, when the bending disc is maximally deformed, the area of contact between the convex portion of the polymer disc and the second major side of the cover glass has a second size greater than the first size;

wherein, when the bending disc is less than maximally deformed, the area of contact between the convex portion of the polymer disc and the second major side of the cover glass has a size less than the second size and greater than the first size;

wherein the area of contact between the convex portion of the polymer disc and the second major side of the cover glass defines an optical aperture controlling an amount of light that can pass through the variable aperture assembly;

wherein a size of the optical aperture is controlled by controlling a size of the area of contact between the convex portion of the polymer disc and the second major side of the cover glass; and wherein the size of the area of contact between the convex portion of the polymer disc and the second major side of the cover glass is controlled by controlling the voltage applied across the first and second electrodes of the bending disc.

2. The variable aperture assembly of claim 1, further comprising a protective cover spanning the center opening of the bending disc;

wherein the protective cover is held in place by the polymer disc.

3. The variable aperture assembly of claim 1, wherein the cover glass comprises optical glass or an optical polymer; and wherein the polymer disc comprises an optical polymer.

4. The variable aperture assembly of claim 3, wherein the optical polymer comprises polydimethylsiloxane.

5. The variable aperture assembly of claim 1, wherein the area of contact between the convex portion of the polymer disc and the second major side of the cover glass when the bending disc is not deformed has a diameter of about 0.4 millimeters; and wherein the area of contact between the convex portion of the polymer disc and the second major side of the cover glass when the bending disc is maximally deformed has a diameter of about 2.0 millimeters.

6. The variable aperture assembly of claim 1, wherein the first major side of the cover glass has an anti-reflective coating.

7. The variable aperture assembly of claim 1, wherein the second major side of the cover glass has a hydrophobic coating.

8. The variable aperture assembly of claim 7, wherein the hydrophobic coating on the second major side of the cover glass does not extend to the perimeter of the second major side of the cover glass.

9. The variable aperture assembly of claim 1, wherein the light absorptive fluid comprises a mixture of deionized water and a light absorptive dye.

10. The variable aperture assembly of claim 1, wherein the polymer disc is over-molded onto the bending disc.

11. A method of controlling an aperture of an imaging device, the method comprising:

providing a variable aperture assembly in an imaging device, the variable aperture assembly positioned in a light path between a shutter and an imaging sensor, the variable aperture assembly comprising:

a piezoelectric annular bending disc defining a center opening and having opposing first and second major sides, the bending disc being selectively deformable toward the first major side when a voltage is applied across first and second electrodes of the bending disc;

a polymer disc having opposing first and second major sides, the second major side of the polymer disc being coupled to the first major side of the bending disc, the polymer disc having a raised perimeter around its first major side, the first side of the polymer disc having a convex portion;

a cover glass having opposing first and second major sides, the second major side of the cover glass being coupled to the raised perimeter of the polymer disc; and a light absorptive fluid contained in a space between the polymer disc and the cover glass;

wherein, when the bending disc is not deformed, an area of contact between the convex portion of the polymer disc and the second major side of the cover glass has a first size;

wherein, when the bending disc is maximally deformed, the area of contact between the convex portion of the polymer disc and the second major side of the cover glass has a second size greater than the first size;

wherein, when the bending disc is less than maximally deformed, the area of contact between the convex portion of the polymer disc and the second major side of the cover glass has a size less than the second size and greater than the first size;

wherein the area of contact between the convex portion of the polymer disc and the second major side of the cover glass defines an optical aperture controlling an amount of light that can pass through the variable aperture assembly;

wherein a size of the optical aperture is controlled by controlling a size of the area of contact between the convex portion of the polymer disc and the second major side of the cover glass; and wherein the size of the area of contact between the convex portion of the polymer disc and the second major side of the cover glass is controlled by controlling the voltage applied across the first and second electrodes of the bending disc; and applying a voltage to the first and second electrodes of the bending disc to cause a deformation of the bending disc corresponding to a desired size of the area of contact between the convex portion of the polymer disc and the second major side of the cover glass.

12. The method of claim 11, wherein the variable aperture assembly further comprises a protective cover spanning the center opening of the bending disc; and wherein the protective cover is held in place by the polymer disc.

13. The method of claim 11, wherein the cover glass comprises optical glass or an optical polymer; and wherein the polymer disc comprises an optical polymer.

14. The method of claim 13, wherein the optical polymer comprises polydimethylsiloxane.

15. The method of claim 11, wherein the area of contact between the convex portion of the polymer disc and the second major side of the cover glass when the bending disc is not deformed has a diameter of about 0.4 millimeters; and wherein the area of contact between the convex portion of the polymer disc and the second major side of the cover glass when the bending disc is maximally deformed has a diameter of about 2.0 millimeters.

16. The method of claim 11, wherein the first major side of the cover glass has an anti-reflective coating.

17. The method of claim 11, wherein the second major side of the cover glass has a hydrophobic coating.

18. The method of claim 17, wherein the hydrophobic coating on the second major side of the cover glass does not extend to the perimeter of the second major side of the cover glass.

19. The method of claim 11, wherein the light absorptive fluid comprises a mixture of deionized water and a light absorptive dye.

20. The method of claim 11, wherein the polymer disc is over-molded onto the bending disc.

\*   \*   \*   \*   \*